(12) United States Patent
Brewer

(10) Patent No.: US 6,573,794 B1
(45) Date of Patent: Jun. 3, 2003

(54) OPERATIONAL AMPLIFIER

(75) Inventor: Robert John Brewer, Lambourn (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/897,150

(22) Filed: Jul. 2, 2001

(51) Int. Cl.[7] .............................................. H03F 3/45
(52) U.S. Cl. ...................................... 330/253; 327/562
(58) Field of Search ............................... 327/52, 65, 561, 327/562; 330/252, 253, 302, 306

(56) References Cited

U.S. PATENT DOCUMENTS

| | | | | |
|---|---|---|---|---|
| 4,205,276 A | * | 5/1980 | Wright et al. ................ | 330/107 |
| 4,667,164 A | * | 5/1987 | Doluca ......................... | 330/253 |
| 4,731,553 A | | 3/1988 | Van Lehn et al. ............. | 326/27 |
| 5,124,663 A | * | 6/1992 | McEntarfer et al. ......... | 330/253 |
| 5,252,868 A | * | 10/1993 | Miida et al. ................. | 327/277 |
| 5,365,126 A | | 11/1994 | Krenik et al. ................. | 326/83 |
| 5,825,250 A | * | 10/1998 | Tomasini et al. ............ | 330/292 |
| 5,963,047 A | | 10/1999 | Kwong et al. ................. | 326/27 |
| 6,087,853 A | | 7/2000 | Huber et al. .................. | 326/83 |
| 6,249,876 B1 | * | 6/2001 | Balakrishnan et al. ....... | 713/501 |

OTHER PUBLICATIONS

Copy of U.S. patent application Ser. No. 09/925,074.

* cited by examiner

*Primary Examiner*—Terry D. Cunningham
*Assistant Examiner*—Quan Tra
(74) *Attorney, Agent, or Firm*—Wolf, Greenfield & Sacks, P.C.

(57) ABSTRACT

The performance of a conventional op amp, having a $g_m$ stage and an integrator, is improved by placing a current mode filter between the $g_m$ stage and the integrator, which has a current gain of much less than one and is substantially without phase shift at the op amp's resonant frequency, permitting stabilization with a relatively small compensation capacitor.

This improves the signal slew rate and harmonic distortion.

7 Claims, 4 Drawing Sheets

OPERATIONAL AMPLIFIER

FIELD OF THE INVENTION

This invention relates generally to operational amplifiers and in particular to improvements in operational amplifier performance, and is more particularly directed toward a filter interposed between the $g_m$ stage and the integrator in a conventional two-stage operational amplifier architecture to improve the amplifier's signal slew rate, gain, and harmonic distortion.

BACKGROUND OF THE INVENTION

The conventional operational amplifier (op amp), illustrated in FIG. 1 in block diagram form, and generally depicted by the numeral 100, comprises two gain stages. The first functions as a differential transconductance ($g_m$) stage 101 and the second as an integrator 103, separated by a differential to single-ended converter 102. The conventional op amp 100 is illustrated in more detail in FIG. 2.

As shown in FIG. 2, the $g_m$ stage 101 comprises a differential pair 201, 202 with a single current source "tail" 203 (both typically, and as an example, p-type insulated-gate field effect transistors), and two current source loads 204, 205 (typically, and as an example, provided by n-type transistors). By selecting an output 206 from only one of the differential input stages, differential to single-ended conversion is accomplished or, conventionally, current sources 204 and 205 are implemented as a mirror with single-ended output 206 derived from the high impedance side of the mirror.

This single-ended output 206 is then applied to the integrator stage 103. In the implementation shown, the integrator 103 includes a p-type output transistor 207 with a current source tail 210, and Miller capacitor 208. A nulling resistor 209 has been added for the sake of stability.

In conventionally designed op amps, the compensation capacitor 208 must be fairly large to forestall the possibility of oscillation. A large capacitor utilizes integrated circuit (IC) area that might otherwise be dedicated to other IC components. In addition, a large compensation capacitor negatively impacts amplifier gain at high frequencies and signal slew rate. Consequently, a need arises for an op amp design that provides improved high frequency gain and signal slew rate while reducing overall circuit area.

SUMMARY OF THE INVENTION

These needs and others are satisfied by the operational amplifier design of the present invention. The performance of an op amp is improved by placing a current mode filter between the $g_m$ stage and the integrator, which has a current gain of much less than one and is substantially without phase shift at the op amp's resonant frequency, permitting stabilization with a relatively small compensation capacitor. This improves the signal slew rate and harmonic distortion.

In accordance with one aspect of the present invention, an improved operational amplifier includes a transconductance amplifier input stage and an integrator output stage. The improvement comprises a current-mode low pass filter interposed between the transconductance amplifier and the integrator.

In one form of the invention, the current mode low pass filter comprises a series resistor coupled between the transconductance amplifier output and the integrator input, a first capacitor connected in parallel with the resistor, and a shunt capacitor coupled between the transconductance amplifier output and ground.

In a preferred form, the series resistor has a resistance value of approximately 2.5 kilohms, the first capacitor connected in parallel with the resistor has a value of approximately 4 picofarads, and the shunt capacitor has a value of approximately 10 picofarads.

In accordance with another form of the invention, the improved operational amplifier further comprises a series damping resistor connected in series with the shunt capacitor. Preferably, the series damping resistor has a value of approximately 100 ohms.

Further objects, features, and advantages of the present invention will become apparent from the following description and drawings.

DETAILED DESCRIPTION OF THE INVENTION

Figure 1:
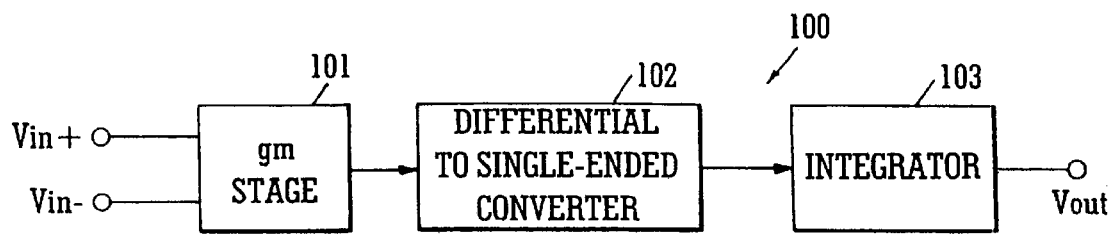
FIG. 1 depicts a conventional operational amplifier of the prior art in block diagram form.
Figure 2:
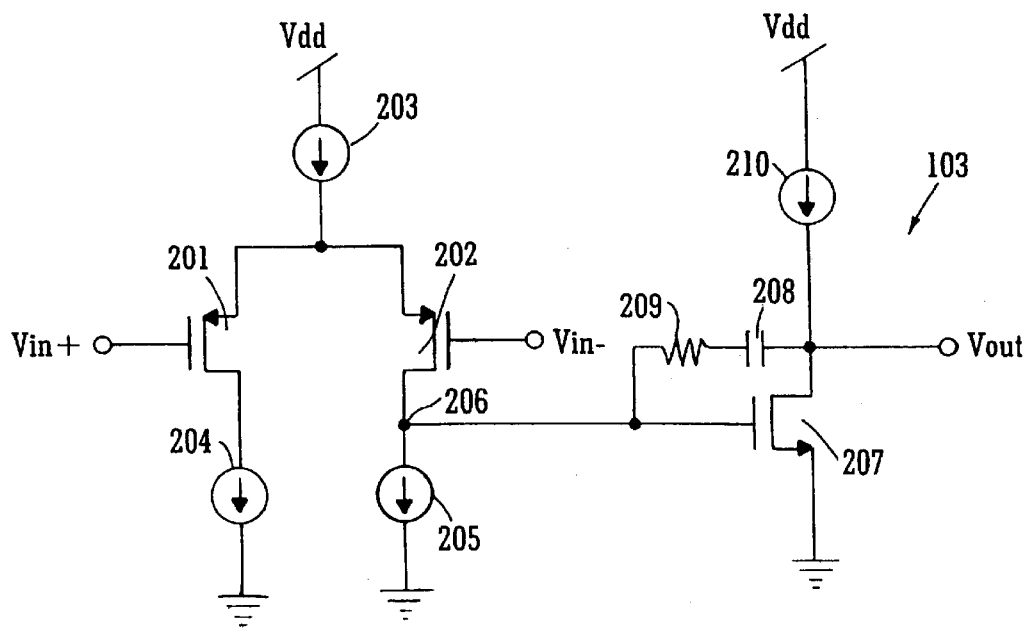
FIG. 2 is a more detailed schematic representation of the op amp of FIG. 1.
Figure 3:
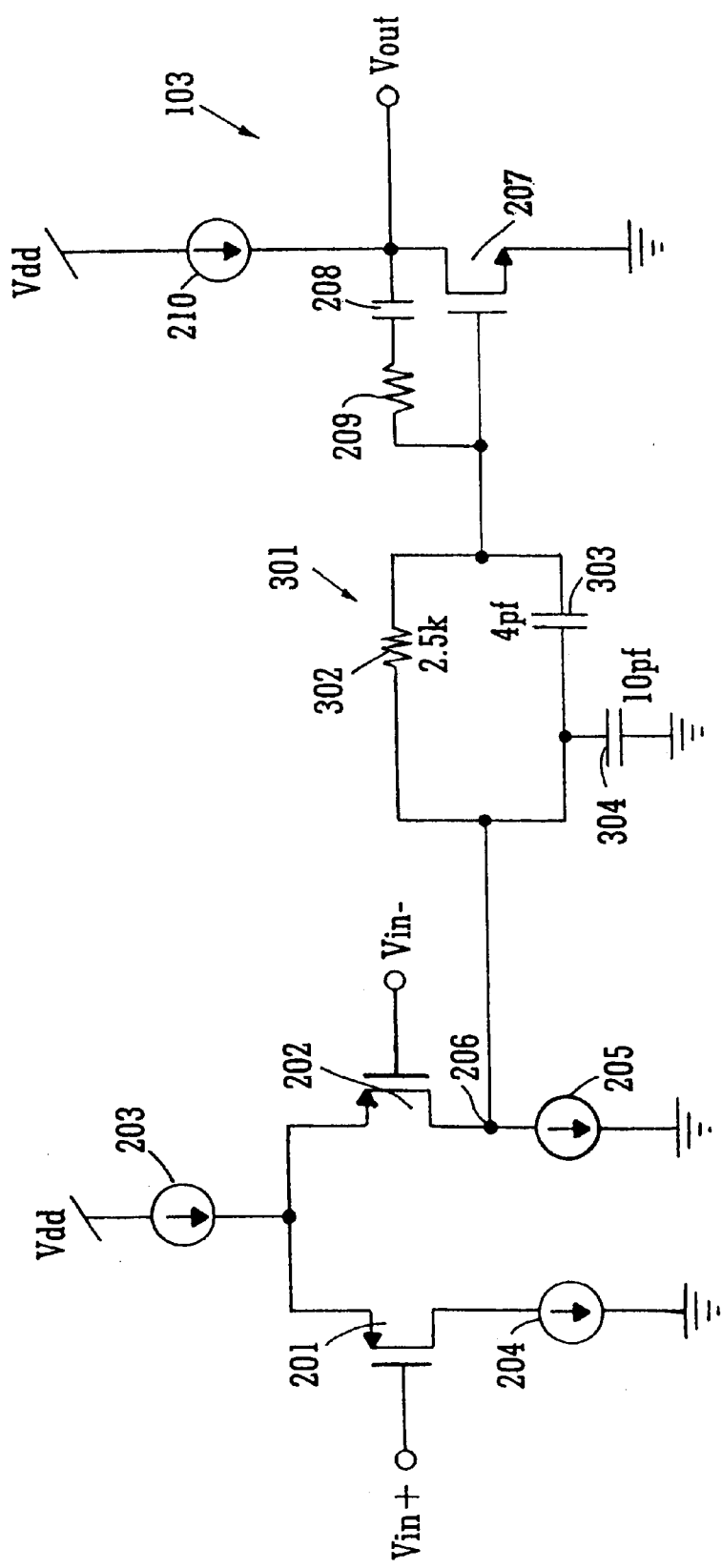
FIG. 3 is a schematic representation of one embodiment of an operational amplifier in accordance with the present invention.

There is described herein an improved operational amplifier that offers distinct advantages when compared to the prior art. FIG. 3 depicts one embodiment of an improved operational amplifier in accordance with the present invention. As can be appreciated from an examination of the drawing, the output 206 of the $g_m$ stage of the op amp is coupled to a filter 301. The filter 301 is interposed between the $g_m$ stage of the op amp and the integrator stage 103.

The filter 301 includes a series resistance 302, preferably having a value of about 2.5 K (kilohms). A capacitor 303 of relatively small value, about 4 picofarads (pf) in the illustrative embodiment, is connected in parallel with the resistor 302. The filter 301 is completed by a shunt capacitor 304 connected to ground at the filter's input side. The shunt capacitor 304 preferably has a value of about 10 pf. Of course, satisfactory results may be obtained using other component values as well.

The amplifier illustrated is a two-stage op amp, since the differential to single-ended conversion is accomplished by the simple expedient of selecting only one output of the differential-mode transconductance amplifier stage. In fact, the benefits of the interposed filter can be realized even in an op amp circuit that has a single-ended input, although this configuration is not illustrated in the drawings. It should be noted that, because of the interconnection between op amp stages, the filter described is effectively a current-mode low pass filter.

The filter's operation may be understood intuitively as follows. Typically, the maximum practical signal frequency is much less than an op amp's resonant or unity gain frequency. For example, the maximum signal frequency may be 1 MHz (megahertz), while the unity gain frequency may be 50 MHz. At low frequencies (much less than 1 MHz), the capacitors 303, 304 are relatively ineffective, and the resistor 302 (of necessity) has a current gain of unity. At high frequencies (greater than 50 MHz), the resistor 302 impedance appears relatively ineffective, and the filter 301 becomes a simple capacitive current divider, with a current gain of 4/14=0.285 (−11 dB) with, most importantly, approaching zero phase shift (less than 12 degrees lag).

Figure 5:
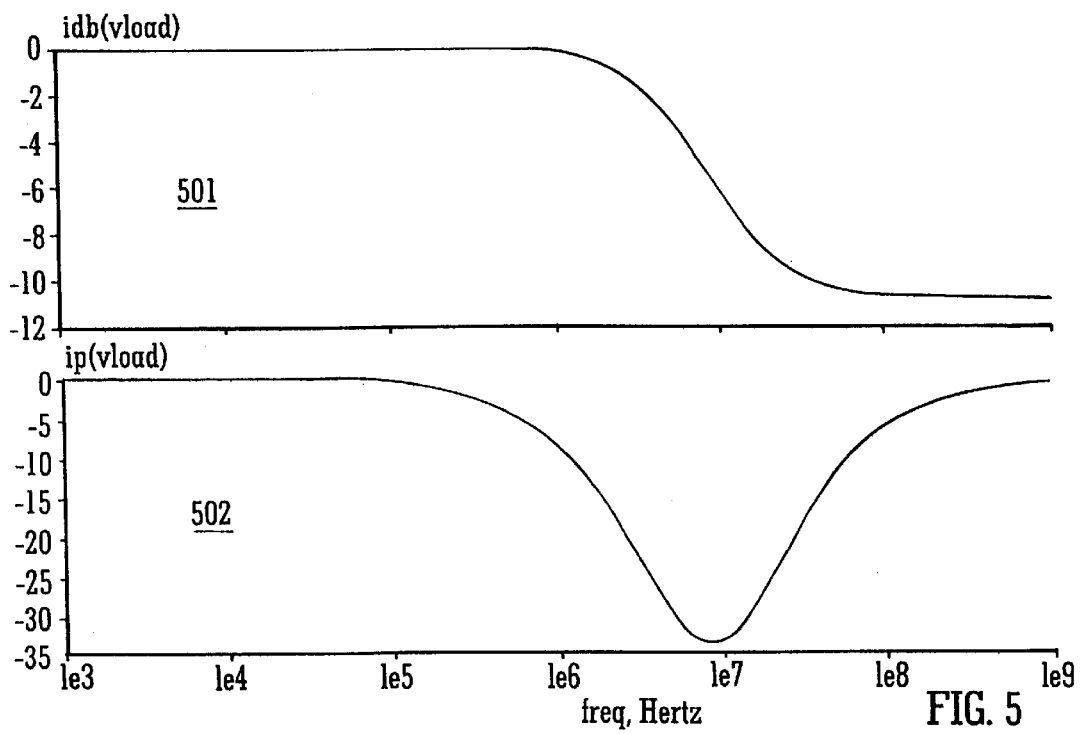
FIG. 5 is a plot of magnitude and phase response for the filter of FIG. 3.

Performance of the filter 301 is illustrated in the magnitude and phase plots of FIG. 5. Transfer function magnitude plot 501 reflects the output current versus input current (current gain) transfer function of the filter 301 itself. The loss through the filter approaches 11 dB asymptotically at high frequencies. The plot 502 is the phase of the current gain transfer function, and indicates that the phase shift still becomes less than 12 degrees at frequencies above 50 MHz where oscillation might occur.

Thus, under these conditions, the op amp may be stabilized with an integrating capacitor 208 (or integrator time constant), a factor of 3.5 times smaller than would otherwise be possible. This means that at the lower signal frequencies, the amplifier has a 3.5 times higher signal slew rate and signal gain than a conventional op amp configuration known in the art.

Figure 4:
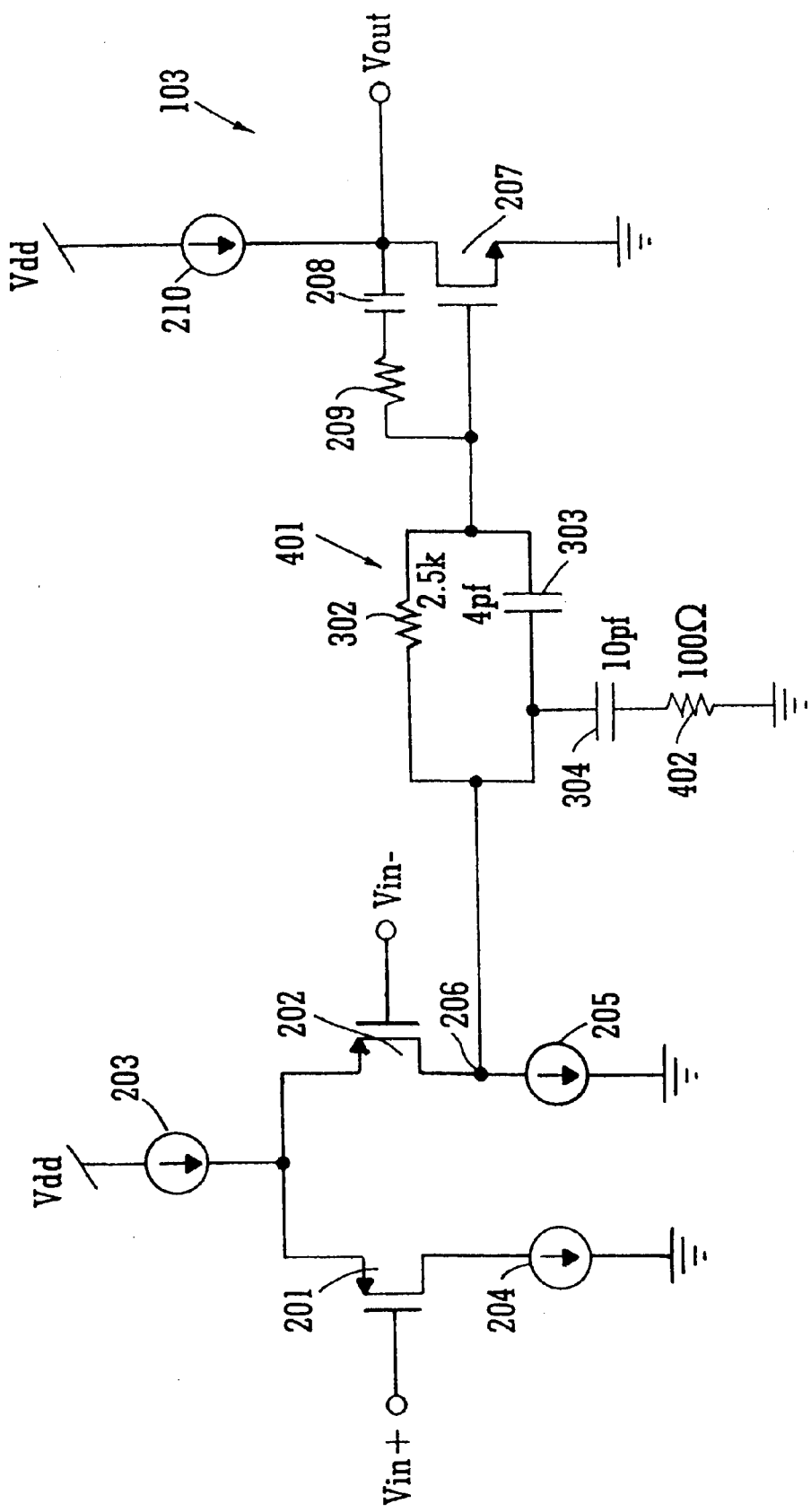
FIG. 4 is a schematic representation of an alternative embodiment of an operational amplifier in accordance with the present invention.
Figure 6:
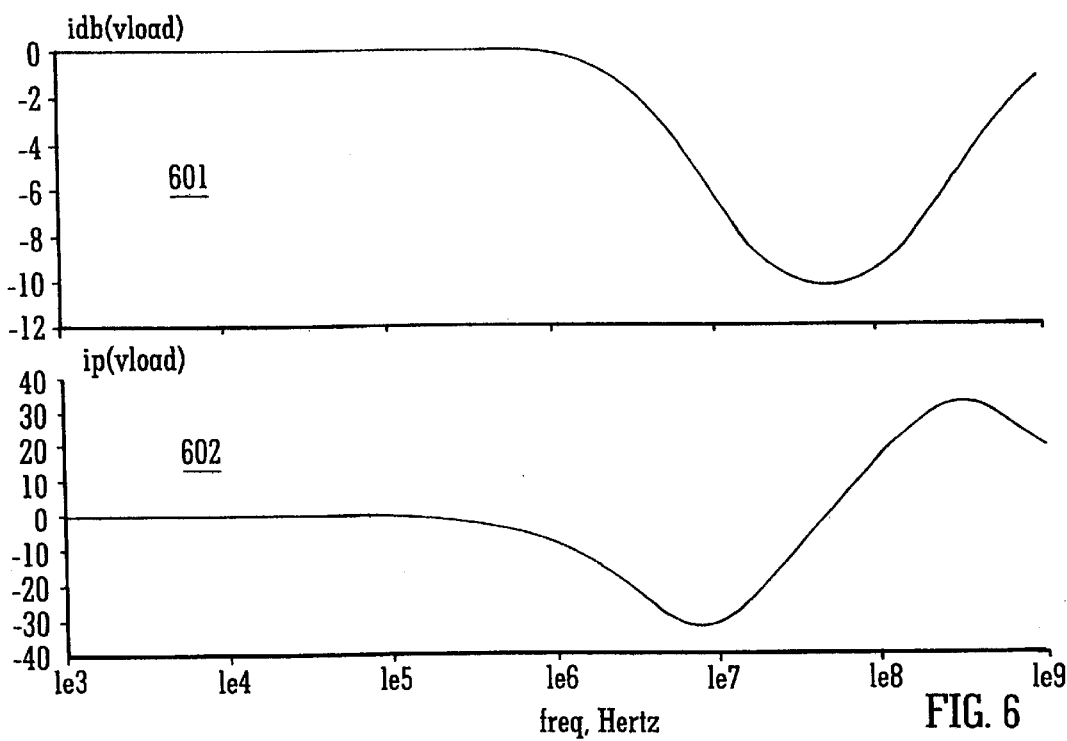
FIG. 6 is a plot of magnitude and phase response for the filter of FIG. 4.

A minor improvement can be realized through the addition of a damping resistor 402 in series with the shunt capacitor 304, as shown in FIG. 4. This improves the phase response at 50 MHz to more exactly zero phase shift at the op amp's resonant frequency, as illustrated by the magnitude and phase plots 601, 602 of FIG. 6. This damping resistor 402 may also be desirable to minimize the ringing of the integrator 103, which may otherwise be provoked by the undamped capacitive loading of its virtual ground input.

It should be noted that the filters 301, 401 described above introduce a slight disadvantage in that the $g_m$ stage is now driving current into a significant resistance (about 2.5K) instead of the usual very low impedance integrator virtual ground. This drive requirement exercises the $g_m$ amplifier's output voltage compliance, which may act to degrade the slew rate and high frequency harmonic distortion performance slightly. Thus, depending upon the details of the implementation, the overall benefit to slew rate and harmonic distortion of this filter may be less than a simple analysis might indicate, but still showing a net performance improvement and reduction in overall circuit area.

There has been described herein an operational amplifier that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. An operational amplifier comprising:
   a transconductance amplifier input stage;
   an integrator output stage; and
   a current-mode low pass filter interposed between the transconductance amplifier and the integrator, wherein the low pass filter comprises:
   a series resistor coupled between the transconductance amplifier output and the integrator input;
   a first capacitor connected in parallel with the resistor; and
   a shunt capacitor coupled between the transconductance amplifier output and ground.

2. The operational amplifier of claim 1, wherein the series resistor has a resistance value of approximately 2.5 kilohms.

3. The operational amplifier of claim 1, wherein the first capacitor connected in parallel with the resistor has a value of approximately 4 picofarads.

4. The operational amplifier of claim 1, wherein the shunt capacitor has a value of approximately 10 picofarads.

5. The operational amplifier of claim 1, wherein the current mode low pass filter further comprises a series damping resistor connected in series with the shunt capacitor.

6. The operational amplifier of claim 5, wherein the series damping resistor has a value of approximately 100 ohms.

7. The operational amplifier of claim 1, wherein the transconductance amplifier input stage is a differential amplifier.

* * * * *